United States Patent

Ott

[11] 4,247,613
[45] Jan. 27, 1981

[54] ELECTRIC FIELD SENSITIZATION OF POLYACETYLENIC MATERIALS

[75] Inventor: Robert J. Ott, Rochester, N.Y.

[73] Assignee: Eastman Kodak Company, Rochester, N.Y.

[21] Appl. No.: 708,161

[22] Filed: Jul. 23, 1976

[51] Int. Cl.³ .................... G03G 5/06; G03G 5/08
[52] U.S. Cl. .................................. 430/31; 430/20; 430/270; 430/336; 430/286
[58] Field of Search .............. 427/124; 204/2; 430/20, 430/31, 54, 336, 927, 286, 287

[56] References Cited

U.S. PATENT DOCUMENTS

| 3,501,308 | 3/1970 | Adelman | 96/48 R |
| 3,726,769 | 4/1973 | Borsenberger et al. | 427/124 |
| 3,772,011 | 11/1973 | Guevara et al. | 96/35.1 |
| 3,794,491 | 2/1974 | Borsenberger et al. | 96/48 R |

Primary Examiner—Edward C. Kimlin
Assistant Examiner—John L. Goodrow
Attorney, Agent, or Firm—John R. Everett

[57] ABSTRACT

A process is disclosed for increasing the radiation sensitivity of a layer containing a polyacetylenic material while at the same time extending its radiation sensitivity towards longer wavelengths. The process comprises applying a substantially uniform electric field across the polyacetylenic containing layer and imagewise exposing the layer while the electric field is uniformly applied. Novel elements capable of recording images from two different portions of the electromagnetic spectrum are also disclosed.

8 Claims, 4 Drawing Figures

ELECTRIC FIELD SENSITIZATION OF POLYACETYLENIC MATERIALS

FIELD OF THE INVENTION

The present invention is directed to a photographic process for producing dye images from polyacetylenic compounds. More specifically, this invention relates to the use of a uniform electric field to enhance the photosensitivity of a polyacetylenic material.

BACKGROUND OF THE INVENTION

Many polyacetylenic compounds form a colored polymer on exposure to radiation and are therefore useful in photography. The use of these compounds has been limited however because of their low sensitivity. Further, many of these compounds which are otherwise desirable, are sensitive only to ultraviolet radiation. As a result of these drawbacks, there has been much effort to improve both the spectral sensitivity and overall sensitivity of processes using polyacetylenic compounds. Thus, in U.S. Pat. No. 3,501,308 to Albert H. Adelman, issued Mar. 17, 1970, the spectral sensitivity of polyacetylenic compounds is extended towards or into the visible region by the presence of an organic $\pi$-acid electron acceptor. In another patent, U.S. Pat. No. 3,794,491 to Paul M. Borsenberger et al issued Feb. 26, 1974, a process for amplifying existing polyacetylenic images is disclosed. A weak image is first formed in the layer by exposure of the layer to radiation to which the polyacetylenic compound is sensitive. The weak image is then amplified by exposing the layer to uniform radiation which is preferentially absorbed by the preformed weak image areas. This process amplifies an existing image and does not alter the spectral sensitivity of the polyacetylenic material.

Several other processes have been suggested which use the polymerization of a polyacetylenic compound to form an image. In U.S. Pat. No. 3,772,011, Paul M. Borsenberger et al describe a process wherein a polyacetylenic compound undergoes imagewise polymerization when contiguous to a photoconductive layer. The photoconductive layer is exposed during the application of an electric potential across the polyacetylenic layer and the photoconductive layer. Borsenberger et al believe that the direct polymerization is a result of charge carriers, ions or free radicals being injected into the polyacetylenic layer from the photoconductor. As a result, the spectral and overall sensitivity of this process may be altered by adding sensitizers to the photoconductive layer. In U.S. Pat. No. 3,726,769, Borsenberger et al. describe a process wherein an image is formed in a polyacetylenic compound containing layer by means of selective arcing adjacent to the surface of the polyacetylenic layer. The image in the polyacetylenic layer is thus formed by a concentrated imagewise electrical potential that is generated between an electrode closely spaced to a sensitive polyacetylenic layer having a conductive backing.

Since polyacetylenic compounds are relatively inexpensive, there is a continuing need for a process using polyacetylenic compounds which have improved sensitivity. It would also be desirable to have a process and element which is capable of recording more than one portion of the electromagnetic spectrum.

SUMMARY OF THE INVENTION

In one aspect of the present invention, there is provided an imaging process which increases the radiation sensitivity of a layer containing a polyacetylenic material while at the same time extending its radiation sensitivity towards longer wavelengths. The imaging process comprises:

(1) applying a substantially uniform electric field across a radiation sensitive layer containing a polyacetylenic material of from about 1 volt/micron up to the dielectric breakdown potential of the radiation sensitive layer; and (2) imagewise exposing the radiation sensitive layer to radiant energy while the electric field is substantially uniformally applied.

In another aspect of the present invention, there is provided a photosensitive article which is capable of recording images from two different portions of the electromagnetic spectrum. The article comprises: conductive support means; first layer means coated on the support means for recording imaging radiation within a first portion of the electromagnetic spectrum; second layer means coated on said first layer means for recording imaging radiation within a second portion of the electromagnetic spectrum differing in wavelength from that of the first portion; and each of the first and second layer means including a polyacetylenic material.

A particularly advantageous feature of the present invention is that the sensitivity of a polyacetylenic layer may be adjusted by suitable selection of a uniformly applied voltage during exposure. It has been discovered that as the applied voltage is increased the sensitivity of the polyacetylenic material is not only increased but is shifted toward longer wavelengths. It is now possible to have an element that may be handled in visible light and also temporarily sensitized to visible light as required. For example, polyacetylenic compounds are typically ultraviolet sensitive. An element having a layer containing a polyacetylenic material, if left in room light for extensive periods of time, would eventually become fogged. If such an element is overcoated with an ultraviolet absorbing layer it is less subject to fog. Since an electric field extends the sensitivity beyond the ultraviolet portion of the spectrum, it is still possible to form an image in such an element by exposing the element while an electric field is applied. The present invention may therefore be used to provide a so-called "add-on" process. A portion of an element containing a ultraviolet sensitive polyyne may be selectively sensitized and exposed to form an image. The unsensitized portion of the element is unaffected by this process and may subsequently be sensitized and exposed to form additional images. Between exposures, the element may be handled in room light without fogging.

The present process enhances the sensitivity of polyacetylenic materials. It is therefore possible to use polyacetylenic materials that are lower in sensitivity than the materials used in prior art processes. The process therefore allows the use of polyacetylenic materials which have advantageous properties, such as image color, cost etc, which would otherwise be discarded because of their low sensitivity.

DESCRIPTION OF THE PREFERRED EMBODIMENTS

Figure 1:
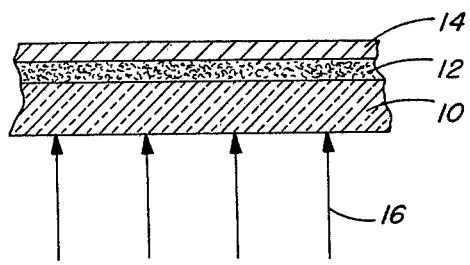
FIG. 1 is a schematic representation of a multi-layer element that is useful in practicing the process of the present invention.

The process according to the present invention may be used with elements taking a wide variety of forms. FIG. 1 illustrates an element that is useful in practicing the process of the present invention. The structure comprises a transparent conductive support 10, an imaging layer 12 containing a polyacetylenic material, and a conductive electrode 14. Radiant energy, indicated by 16, imagewise exposes the polyacetylenic material through the transparent conductive support 10 while a voltage is applied between the conductive support 10 and the rear electrode 14. The voltage is applied between conductive support 10 and rear electrode 14 so that a substantially uniform electric field of at least about 1 volt/micron is maintained across imaging layer 12 during exposure.

Alternatively conductive support 10 can be opaque. In this embodiment, imaging layer 12 is exposed through electrode 14 which can be transparent. In still another embodiment, the imaging layer 12 can be a self-supporting laye of polyacetylenic material incorporated in a suitable binder. Imaging layer 12 can then be sandwiched between a conductive support 10 and a rear electrode 14 to form a separable laminate. As will be readily appreciated, other element configurations are useful herein so long as it is possible to subject simultaneously the polyacetylenic material to a voltage gradient of at least about 1 volt/micron and to imaging radiation.

Figure 2:
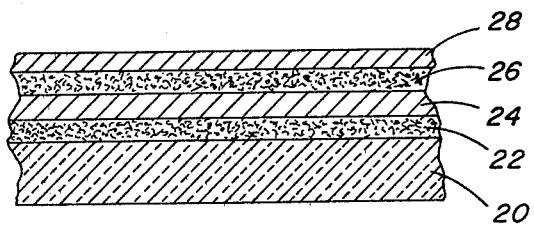
FIG. 2 is a schematic representation of a multi-layer element of the invention capable of recording images from two portions of the electromagnetic spectrum.

FIG. 2 shows a radiation sensitive element according to the present invention that is capable of recording multiple images from different portions of the electromagnetic spectrum. In FIG. 2 there is shown an element having a conductive support 20 which can be opaque or transparent. Adjacent to conductive support 20 is a first radiation sensitive layer 22 for recording imaging radiation within a first portion of the electromagnetic spectrum. Over the first layer 22 is a second radiation sensitive layer 26 for recording imaging radiation within a second portion of the electromagnetic spectrum. Shown between radiation sensitive layers 22 and 26 is separating layer 24 which can be a filter layer or a conductive layer. To complete the element, there is provided an electrode 28. A voltage can be applied across the radiation sensitive layers 22 and 26 by attaching a power source across electrode 28 and conductive support 20 and/or separating layer 24.

The radiation sensitive layers 22 and 26 are sensitive to different portions of the electromagnetic spectrum. This can be accomplished by judicious selection of polyacetylenic compounds or by incorporating sensitizers in one or both of the layers. For example, the first radiation sensitive layer 22 can have an incorporated sensitizer so as to sensitize the layer, which would otherwise be sensitive to ultraviolet radiation, to visible radiation. Separating layer 24, between radiation sensitive layers 22 and 26, can contain an ultraviolet absorber. The second radiation sensitive layer 26 containing the same polyacetylenic material is provided without a sensitizer so that its sensitivity remains in the ultraviolet portion of the spectrum. Exposure of this element, through the electrode 28 to imaging radiation in the visible portion of the spectrum, while a voltage is being applied between conductive support 20 and electrode 28, results in an image in the first radiation sensitive layer 22. Subsequent or simultaneous exposure of the element to imaging radiation in the ultraviolet portion of the spectrum results in an image in the second radiation sensitive layer 26. Radiation sensitive layer 22 is substantially unaffected by the ultraviolet exposure because of the ultraviolet absorber in separating layer 24. The polyacetylenic material for the first radiation sensitive layer 22 and the second radiation sensitive layer 26 can be chosen so that their respective images differ in color.

When separating layer 24 is a conductive layer, layers 22 and 26 can be made sensitive to different portions of the spectrum by applying different voltages across these layers. An image can be formed in layer 22 by exposing layer 22 while applying a voltage between separating layer 24 and conductive support 20. Radiation sensitive layer 26 can be sensitized to a different portion of the electromagnetic spectrum by applying a voltage across separating layer 24 and electrode 28 that is different from the voltage applied across separating layer 24 and conductive support 20. In this manner, the sensitivity, both in terms of spectral and overall sensitivity, can be independently determined for radiation sensitive layers 22 and 26.

Electrodes 14 or 28 can be of an area that is sufficient to sensitize a portion of the radiation sensitive layer or layers. Thus, electrodes 14 or 28 can be a transparent conductive layer carried by a transparent support that can be positioned against a portion of the radiation sensitive layer or layers. Applying a voltage between conductive support 10 or 20 and electrode 14 or 28 and imagewise exposing, results in an image in the desired position on the element without affecting the remainder of the radiation sensitive layer. The process can then be repeated with another image in another position on the radiation sensitive layer.

The sensitivity of polyacetylenic materials has been found to increase with increasing applied voltage. While a useful increase in sensitivity is attained when the voltage gradient is at least about 1 volt/micron it is preferred that the gradient be at least about 5 volts/micron. Both direct current and rectified alternating current sources can be used to provide the required gradient. When rectified alternating current is used, it is sufficient that the peak voltage gradient be at least about 1 volt/micron.

The sensitivity of the polyacetylenic layer may further be increased by heating the layer. Any method of heating the layer is suitable so long as the polyacetylenic material is below its melting point when exposed. Illustrative methods of heating the layer include: placing an element containing the polyacetylenic layer against a heated platen; impinging heated air on the element; heating the electrode that is placed in contact with the layer; and the like. It is generally preferred to expose the polyacetylenic layer while it is about 10° C. above ambient temperature.

It is known that polyacetylenic materials can be sensitive to a broad spectrum of electromagnetic radiation. Radiant energy, as used herein, is intended to include this broad spectrum of radiant energy, encompassing not only the ultraviolet and visible regions (i.e., actinic radiation) but also electron beams, such as developed by cathode ray guns, gamma-rays, x-rays, beta-rays, and other forms of corpuscular and/or wave-like energy generally deemed to be radiant energy.

Radiation sensitive polyacetylenic layers useful in the present invention as well as any other layers between the conductive layers must be able to withstand a voltage gradient of at least 1 volt/micron without dielectric breakdown. Polyacetylenic materials coated alone typically meet this criteria. Where the polyacetylenic material or other component (such as ultraviolet absorber) is to be coated in a layer with a binder, it is preferred that the binder have a fairly high dielectric strength. Binders of this type include styrene-butadiene copolymers; silicone resins; styrene-alkyd resins; silicone-alkyd resins; soya-alkyd resins; poly(vinyl chloride); poly(vinylidene chloride); vinyl chloride-vinylidene chloride copolymers; vinylidene chloride-acrylonitrile copolymers, poly(vinyl acetate); vinyl acetate vinyl chloride copolymers; poly(vinyl acetals), such as poly(vinyl butyral); polyacrylic and methacrylic esters, such as poly(methyl meracrylate), poly(n-butylmethacrylate), poly(isobutyl methacrylate), etc; polystyrene; nitrated polystyrene; polymethylstyrene; isobutylene polymers; polyesters, such as copoly[ethylene-co-alkylenebis(alkyleneoxyaryl)phenylene-dicarboxylate], e.g., poly[ethylene-co-isopropylidene-2,2-bis-(ethyleneoxyphenyl)terephthalate]; phenolformaldehyde resins, ketone resins; polyamides; polycarbonates; polythiocarbonates; copolymers of vinyl haloarylates and vinyl acetate such as poly(vinyl-m-bromobenzoate-co-vinyl acetate); waxes, chlorinated polyethylene, etc. Especially preferred are thermoplastic resins. Suitable resins are sold under such trademarks as Vitel PE-101 (a polyester resin from Goodyear Tire and Rubber Co.), Gelvatol (a poly(vinylalcohol) from Monsanto Corp.), Cymac (a methylstyrene from American Cyanamid), Piccopale 100 (unsaturated hydrocarbon resin from Penn. Ind. Chem. Co.), Saran F-200 (a vinylidene chloride-acrylonitrile copolymer from Dow Chemical Co.), Pliolite (styrene-butadiene polymers from the Goodyear Corp.) Lexan 145 (a Bisphenol A polycarbonate from General Electric) and Geon 222 (a vinyl chloride-vinylidene chloride resin from Goodrich.) Also, mixtures of these binders can be used.

While high dielectric strength binders are preferred, the polyacetylenic material or other component can be coated with a wide variety of conventional photographic binders. As is well known in the art in the preparation of smooth uniform continuous coatings of binder materials, there can be employed therewith small amounts of conventional coating aids such as viscosity controlling agents, leveling agents, dispersing agents, and the like. The particular binder material employed is selected with due regard to the specific radiant energy that is to be used to expose the polyacetylenic material, and invariably is a binder material permitting substantial transmission of that specific radiant energy.

Where the polyacetylenic material is to be incorporated with a binder, polyacetylenic material to binder ratios (by weight) can range from about 0.1 to about 3.0 or higher. In terms of coating density, sufficient polyacetylenic material can be utilized to provide from about 10 to 2,000 mg of material per 0.093 m$^2$ of coated element.

Conventional polyacetylenic imaging materials are useful in the practice of this invention. Photosensitive polyacetylenic compounds typically contain a minimum of two acetylenic linkages as a conjugated system. The preparation of these compounds as well as methods for determining their photosensitivity are well known in the art. Preparatory techniques are taught for example in U.S. Pat. Nos. 2,816,149; 2,941,014 and 3,065,283. A method for determining their radiation sensitivity can be found in U.S. Pat. No. 3,501,308.

Illustrative and representative of the radiant energy sensitive polyacetylenic compounds to which the invention is applicable are those disclosed in U.S. Pat. Nos. 3,501,297; 3,501,302; 3,501,303; and 3,501,308. Of particular utility are the polyacetylenic bisurethanes as described in 100 *Product Licensing Index* 10037; the alkylamide polyacetylenic compounds as described in 100 *Product Licensing Index* 10036; and the 1-carboxypolyynes disclosed in 116 *Research Disclosure* 59. Combinations of polyacetylenic compounds may also be used to advantage in the process according to the present invention. Particularly, useful combinations of polyacetylenic compounds are described in 106 *Research Disclosure* 23. As used herein "polyacetylenic material" refers to either an individual compound or combinations of polyacetylenic compounds.

If it is desired to prepare a binder-free layer of the polyacetylenic material, this can be accomplished by applying to a substrate a solution of the polyacetylenic material in a suitable solvent followed by drying. Alternatively, the polyacetylenic material may be coated on a suitable support by a vacuum deposition as described in 100 *Product Licensing Index* 10035.

Although not necessary for the practice of the present invention, the polyacetylenic materials useful herein can be chemically sensitized. Suitable chemical sensitizer are disclosed for example in U.S. Pat. No. 3,501,308. Other sensitizers can also be used such as arylazides. Compounds such as p-azidobenzoic acid, p-nitrophenylazide, p-dimethylphenylazide, 2,6-di-p-azidobenzilidene-4-methylcyclohexanone, 2-azido-1-(carbobutoxy-methylcarbamyl)-benzimidazol, 2,5-bis-(4-azidophenyl)-1,3,4-oxydiazole and the like are particularly useful. Triplet sensitizers can also be used to sensitize the polyacetylenic compounds used herein. The polyacetylenic compounds can also be sensitized by the use of n-alkoxypyridines, n-alkoxyquinolen and n-alkoxy-2-phenylindoles. The sensitivity of polyacetylenic compounds can also be substantially extended by the presence of pyrylium, thiapyrylium, and selenapyrylium compounds as described in U.S. Pat. No. 3,772,028 to Fico et al. The amount of sensitizer that is useful herein varies depending on the particular sensitizer, polyacetylenic material and other element components if any. One skilled in the art can easily determine the optimum sensitizer concentration by simple experiment.

Suitable supporting materials for the elements of the present invention can include any of a wide variety of electrically conducting supports, for example, various conducting papers; aluminum coated paper; aluminum paper laminates; metal foils such as aluminum foil, zinc foil, etc; metal plates such as aluminum, copper, zinc, brass, and galvanized plates; vapor deposited metal layers such as silver, nickel or aluminum on conventional glass or film supports such as cellulose acetate, poly(ethylene terephthalate), polystyrene and the like conducting supports. An especially useful conducting support can be prepared by coating a support material such as poly(ethylene terephthalate) with a layer containing a semi-conductor dispersed in a resin as described in U.S. Pat. No. 3,245,833 or vacuum deposited on the support. Likewise, a suitable conducting coating can be prepared from the sodium salt of a carboxyester lactone of a maleic anhydride-vinyl acetate copolymer. These conducting layers and methods for their optimum preparation and use are disclosed in U.S. Pat. Nos. 3,007,901; 3,245,833 and 3,267,807. Typically, the conductive layers useful in the present invention have a resistivity of $10^9$ ohms per square centimeter or less.

The transparent conductive layer, whether part of a transparent support or a separate layer, can be any of a wide variety of materials. Thin metal coatings are known in the art to form transparent conductive coatings. Metals which form such coatings include gold, aluminum, chromium, nickel, copper and the like. Other suitable transparent electrodes are described, for example, in U.S. Pat. Nos. 2,808,351 to Colbert et al; 3,007,901 to Minsk; 3,245,833 to Trevoy; 3,267,807 to Swope et al.

The following examples are submitted to illustrate the invention and not to limit it in any way. Unless otherwise indicated all percentages are by weight. Throughout the examples the voltage across the polyacetylenic layer is referred to as positive when the conductive support onto which the layer has been coated is maintained positive relative to the voltage of the other electrode. The net optical transmission density refers to the transmission density of the image minus the transmission density of the background as measured through the recited filter.

EXAMPLE 1

A 25% solution of 2,4-hexadiyne-1,6-diol bis(N-hexylurethane) was prepared using a solvent mixture of 10% trichloroethane and 90% dichloromethane. The filtered solution was coated with a 100-micron doctor blade over a layer of Cr-SiO which has been coated to a 0.1 density onto a poly(ethylene terephthalate) film support. The Cr-SiO coating was deposited as described in U.S. Pat. No. 2,808,351 to Colbert et al. This coating was placed against a liquid mercury electrode so that the layer containing the polyacetylenic material contacted the liquid mercury. The coating was exposed through the film base to 540 nm radiation at a radiation intensity of $10^6$ ergs/cm$^2$ for 307 seconds while a voltage of 450 V was applied across the coating. The exposure resulted in an image which had a net Wratten 93 transmission optical density of 0.5. No image was formed when a sample of the element was so exposed without voltage being applied.

EXAMPLE 2

Example 1 was repeated except that the exposing radiation was 460 nm and the exposure time was 300 sec. An image was formed whose net Wratten 93 transmission optical density was 0.24. No image was formed when a similar sample was exposed without the voltage being applied.

EXAMPLE 3

Example 2 was repeated except that 400 nm radiation was used to expose the sample for 500 sec. The net Wratten 93 transmission optical density was 0.65.

EXAMPLE 4

Figure 3:
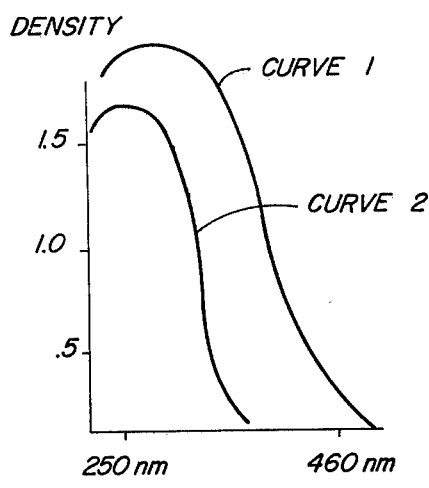
FIG. 3 is a plot of density vs. wavelength which shows the effect of applying an electric field to a polyacetylenic material during exposure.

A 20% solution of 10,12-docosadiynedioic acid monomethyl ester in dichloromethane was prepared and filtered. The solution was coated with a 50-micron doctor blade over a layer of Cr-SiO which had been coated as in Example 1 on Aclar [poly(dichlorodifluoroethylene) Allied Chemical]. This coating was placed against a liquid mercury electrode so that the layer containing the polyacetylenic material contacted the liquid mercury. A potential of 400 volts was applied across the polyacetylenic layer. A series of exposures were made using monochromatic radiation, each exposure being a different wavelength. The exposure in each case was about $10^6$ ergs/cm$^2$. Curve 1 of FIG. 3 is a plot of the net Wratten 92 optical transmission density vs. the wavelength of the exposure. Curve 2 is a similar plot except no voltage was applied across the polyacetylenic layer. FIG. 3, shows the enhancement of the polyacetylenic image due to the application of an electric field during exposure. The sensitivity is not only increased but is also moved into the visible portion of the spectrum.

EXAMPLE 5

Figure 4:
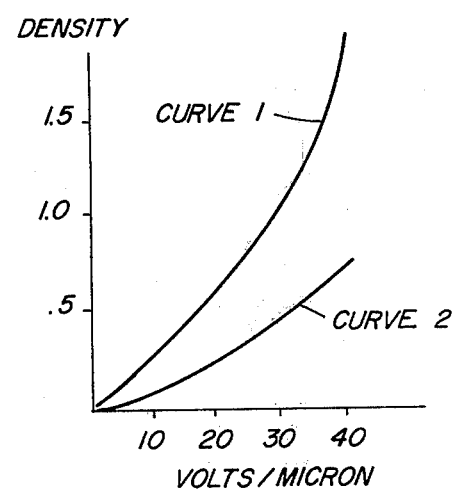
FIG. 4 is a plot of density vs. voltage gradient which illustrates the effect of applied voltage on the photosensitivity of polyacetylenic material.

A 20 percent solution of 10,12-docosadiynedioic acid monomethyl ester dissolved in dichloromethane was prepared and filtered. The filtrate was coated with a 100-micron doctor blade over a layer of nickel which had been evaporated onto a poly(ethylene terephthalate) film support to a 0.4 density. Samples of the resulting element were placed against the liquid mercury electrode with the polyacetylenic layer in contact with the liquid mercury. A series of exposures were made varying the potential across the polyacetylenic layer. FIG. 4, curve 1 shows a plot of net Wratten 92 optical transmission density plotted vs. the applied voltage. The exposure for curve 1 was $3.3 \times 10^6$ ergs/cm$^2$ using monochromatic 365 nm radiation. FIG. 4, curve 2 shows the results of a similar experiment wherein the exposure was $1.3 \times 10^6$ ergs/cm$^2$ at 365 nm. These plots show that as the potential across the polyacetylenic layer is increased, its sensitivity is also increased.

EXAMPLE 6

Equal portions of the 20% polyacetylenic solution described in Example 4, and a 20% Gelvatol/acetone solution were combined and coated with a 100-micron doctor blade on the support described in Example 4. The element was placed in contact with a liquid mercury electrode, as in Example 4, and a potential of 800 volts was applied across the polyacetylenic material-binder layer. The sample was exposed to 365 nm radiation for 60 seconds at a radiation intensity of 1 mW/cm$^2$ sec. An image resulted which had a net Wratten 92 density of about 1.0. The experiment was repeated with the exception that no voltage was applied across the film. No image resulted.

EXAMPLE 7

A 15 percent solution of N,N'-bis(2-methoxyethyl)-10,12-docosadiyne diamide in dichloromethane was prepared and filtered. The solution was coated as in Example 4. The sample was placed in contact with a mercury electrode as in Example 4 and a 100 volt potential was applied. The sample was exposed for 120 seconds to 375 nm radiation having an intensity of 1 mW/cm$^2$ sec. An image was formed whose net Wratten 92 transmission optical density was about 0.3. When no voltage was applied across the element, and the element was similarly exposed, no image resulted.

EXAMPLE 8

One part of the polyacetylenic solution from Example 7 was combined with four parts of a 15% solution of Pliolite in dichloromethane. The resulting solution was coated and exposed as in Example 7 except that the voltage was minus 400 volts. An image whose net Wratten 92 density was about 0.15 was obtained. A similar sample exposed without the voltage being applied, gave no image.

EXAMPLE 9

One part of the polyacetylenic solution from Example 7 was combined with four parts of a 15% solution of Lexan 145 in dichloromethane. This solution was coated and exposed as in Example 7 with the exception that the voltage applied was 150 volts, the wavelength of actinic radiation was 365 nm and the exposure time was 30 seconds. An image was formed whose net Wratten 92 optical transmission density was 0.5. No image was formed when a similar sample was exposed without the applied voltage.

EXAMPLE 10

A solution was made and coated as in Example 9 except that the proportion was 40% polyacetylenic solution to 60% Lexan 145 solution. The liquid mercury electrode was replaced by an aluminum foil electrode. A voltage of 300 volts was placed between the aluminum foil and the conductive film support and the element was exposed to 390 nm radiation for 300 sec. An image resulted having a net Wratten transmission optical density of 0.25. No image resulted when a similar element was exposed without the applied voltage.

EXAMPLE 11

Equal parts of a 20% solution of 10,12-docosadiynedioic acid monomethyl ester in dichloromethane and a 20% Pliolite solution in dichloromethane were combined and coated with a 150-micron doctor blade on the Cr-SiO layer of the conductive support described in Example 4. The resulting element was placed with the polyacetylenic layer in contact with the Cr-SiO layer of a second conductive support. A voltage of 2500 volts was placed between the two Cr-SiO layers and the element was exposed to 375 nm radiation for 480 sec through the coated base. An image resulted having a net Wratten 92 transmission optical density of 0.50. Similar results were obtained when a sample was exposed through the rear electrode rather than the coated base. Similar results were also obtained when the voltage polarity was reversed.

EXAMPLE 12

A 30% solution of the polyacetylenic compound of Example 4 was prepared and filtered. Three parts of this solution were added to one part of a 6% solution of 2-methoxy-2-phenylacetophenone dissolved in trichloroethylene. The resulting solution was then coated with a 50-micron doctor blade onto the Cr-SiO layer of the conductive support described in Example 4. A 500 volt potential was applied across the polyacetylenic layer and the element was exposed to 375 nm radiation for 300 sec. A blue image resulted with a net Wratten 92 transmission optical density of 0.6.

EXAMPLE 13

Equal parts of a 20% solution of N,N'-bis(2-methoxyethyl) 10,12-docosadiyne diamine in dichloromethane and a 20% solution of Pliolite in dichloromethane were combined and coated with a 150-micron doctor blade on the Cr-SiO layer of the conductive support described in Example 4.

An ultraviolet absorbing layer was prepared by coating a solution of ultraviolet dye along with a binder. The solution was prepared by dissolving 3 grams of the dye 5-(4-methoxy-3-sulfo) benzylidene-2-phenylimino-3-N-octalthiazolidone sodium salt in 100 ml of methanol and mixing one part of the resulting solution with 1 part of a 10% by weight solution of a poly(vinyl alcohol) solution in water. The solution was applied to the polyacetylenic layer described above with a 100-micron doctor blade and allowed to dry at 90° F.

A second polyacetylenic layer was coated on top of the ultraviolet absorbing layer. Equal parts of a 20% solution of 2,4-hexadiyne-1-6-diol bis(n-hexylurethane) in a solvent mixture of 10% trichloroethane—90% dichloromethane and a 20% Pliolite in dichloromethane solution were combined and coated with a 100-micron doctor blade.

The element thus formed was placed against a liquid mercury electrode with the second polyacetylenic layer in contact with the electrode. A potential of 4000 volts was placed between the Cr-SiO and the mercury electrode. The sample was exposed to 375 nm radiation and a blue image was formed in the first polyacetylenic layer.

Another portion of the sample was similarly exposed except that the radiation was 425 nm. A red image was formed in the second polyacetylenic layer.

A third portion of the sample was exposed to both the 375 nm radiation and the 425 nm radiation. A purple image was formed.

The invention has been described in detail with particular reference to certain preferred embodiments thereof, but it will be understood that variations and modifications can be effected within the spirit and scope of the invention.

I claim:
1. An imaging process comprising:
   (1) applying a substantially uniform electric field across a radiation-sensitive layer containing a polyacetylenic material of from about 1 volt/micron up to the dielectric breakdown potential of the radiation-sensitive layer; and
   (2) imagewise-polymerizing said polyacetylenic material by radiant energy by imagewise-exposing said radiation-sensitive layer to radiant energy while said electric field is substantially uniformly applied and maintained, thereby forming a visible image, said radiant energy being chosen so that when applied in the absence of an electric field no visible image is produced.
2. A process according to claim 1 wherein said radiation sensitive layer contains a polyacetylenic material having a minimum of two acetylenic linkages as a conjugated system.
3. A process according to claim 1 wherein said voltage gradiant is at least about 5 volts/micron.
4. A process according to claim 1 wherein said polyacetylenic material is selected from the group consisting of 10,12-docosadiynedioic acid monomethyl ester;

N,N'-bis(2-methoxyethyl)-10,12-docosadiynediamine and 2,4-hexadiyne-1,6-diol bis(n-hexylurethane).

5. A process according to claim 1 where said radiation sensitive layer comprises a binder and a polyacetylenic material having a minimum of two acetylenic linkages as a conjugated system.

6. A process according to claim 1 where said radiation sensitive layer comprises a polyacetylenic material having a minimum of two acetylenic linkages as a conjugated system and a sensitizer.

7. A process according to claim 1 wherein said electric field is applied to only a portion of an element having a layer containing a polyacetylenic material.

8. A process according to claim 1 further comprising heating said layer containing a polyacetylenic material.

* * * * *